United States Patent
Deak

(10) Patent No.: US 7,411,262 B2
(45) Date of Patent: Aug. 12, 2008

(54) SELF-ALIGNED, LOW-RESISTANCE, EFFICIENT MEMORY ARRAY

(75) Inventor: James G. Deak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 527 days.

(21) Appl. No.: 11/212,646

(22) Filed: Aug. 29, 2005

(65) Prior Publication Data

US 2006/0003471 A1  Jan. 5, 2006

Related U.S. Application Data

(60) Division of application No. 11/025,913, filed on Jan. 3, 2005, which is a continuation of application No. 10/409,127, filed on Apr. 9, 2003, now Pat. No. 6,921,953.

(51) Int. Cl.
*H01L 29/82* (2006.01)
*H01L 43/00* (2006.01)

(52) U.S. Cl. .................. 257/421; 257/108; 257/414; 257/422; 257/659; 438/3; 438/48

(58) Field of Classification Search ............... None
See application file for complete search history.

(56) References Cited

U.S. PATENT DOCUMENTS

| | | |
|---|---|---|
| 6,413,788 B1 | 7/2002 | Tuttle |
| 6,538,920 B2 | 3/2003 | Sharma |
| 6,551,852 B2 | 4/2003 | Tuttle |
| 6,597,049 B1 | 7/2003 | Bhattacharyya |
| 2002/0160541 A1 | 10/2002 | Durcan et al. |

*Primary Examiner*—Zandra Smith
*Assistant Examiner*—Khanh B Duong
(74) *Attorney, Agent, or Firm*—Dickstein Shapiro LLP

(57) ABSTRACT

The present invention seeks to reduce the amount of current required for a write operation by using a process for forming the read conductor within a recessed write conductor, the write conductor itself formed within a trench of an insulating layer. The present invention protects the MTJ from the voltages created by the write conductor by isolating the write conductor and enabling the reduction of current necessary to write a bit of information.

12 Claims, 16 Drawing Sheets

SELF-ALIGNED, LOW-RESISTANCE, EFFICIENT MEMORY ARRAY

This is a divisional of application Ser. No. 11/025,913, which is a continuation of application Ser. No. 10/409,127 filed Apr. 9, 2003, now U.S. Pat. No. 6,921,953, issued on Jul. 26, 2005, the entire disclosures of which are hereby incorporated by reference.

FIELD OF THE INVENTION

The present invention relates generally to magnetoresistive random access memory (MRAM), and more specifically, to read and write conductors for MRAM.

BACKGROUND OF THE INVENTION

Integrated circuit designers have always sought the ideal semiconductor memory: a device that is randomly accessible; can be written to or read from very quickly; is non-volatile, but indefinitely alterable; and consumes little power. Magnetoresistive random access memory (MRAM) technology has been increasingly viewed as offering all of these advantages.

An MRAM memory cell contains a non-magnetic conductor forming a lower electrical contact, a pinned magnetic layer, a barrier layer, a free magnetic layer, and a second non-magnetic conductor. The pinned magnetic layer, tunnel barrier layer, and free magnetic layer are collectively termed the magnetic tunnel junction (MTJ) element.

Information can be written to and read from the MRAM cell as a "1" or a "0," where a "1" generally corresponds to a high resistance level, and a "0" generally corresponds to a low resistance level. Directions of magnetic orientations in the magnetic layers of the MRAM cell cause resistance variations. Magnetic orientation in one magnetic layer is magnetically fixed or pinned, while the magnetic orientation of the other magnetic layer is variable so that the magnetic orientation is free to switch direction. In response to the shifting state of the free magnetic layer, the MRAM cell exhibits one of two different resistances or potentials, which, as described above, are read by the memory circuit as either a "1" or a "0." It is the creation and detection of these two distinct resistances or potentials that allows the memory circuit to read from and write information to an MRAM cell.

A bit of information may be written into the MTJ element of an MRAM cell by applying orthogonal magnetic fields directed within the XY-plane of the MTJ element. Depending on the strength of the magnetic fields, which are created by a current passing through the write line, the free magnetic layer's polarization may remain the same or switch direction. The free magnetic layer's polarization then may continue to be parallel to the pinned magnetic layer's polarization, or anti-parallel to the pinned magnetic layer's polarization.

A bit of information is retrieved from the MTJ element by measuring its resistance via a read current directed along the Z-axis, transverse to the XY-plane. The state of the MTJ element can be determined by the read conductor measuring the resistance of the memory cell. The MTJ element is in a state of low resistance if the overall orientation of magnetization in the free magnetic layer is parallel to the orientation of magnetization of the pinned magnetic layer. Conversely, the MTJ element is in a state of high resistance if the overall orientation of magnetization in the free magnetic layer is anti-parallel to the orientation of magnetization in the pinned magnetic layer.

Conventional MRAM structures, such as that depicted in FIG. 1, typically have a write conductor 20 and a read conductor 26, separated by a liner 17, together forming a word line 32. Other layers may be included, but are omitted for clarity. The word line 32 of a conventional MRAM structure is typically formed in a first insulating layer (typically an oxide layer) 10, with an MTJ element 28 formed over the word line 32. Typically, the read conductor 26 is less than 500 nm wide and less than 50 nm thick. The dimensions of the read conductor 26 and the liner 17 separate the MTJ element 28 from the write conductor 20.

Conventional MRAM structures electrically isolate the write conductor 20 from the MTJ element 28 to protect the MTJ element 28 from a voltage created when a current is applied to the write conductor 20 to write a bit of information onto the MTJ element 28. However, by isolating the write conductor 20 from the MTJ element 28, a higher current is necessary to achieve the same electromagnetic field to write a bit of information if the write conductor 20 was not electrically isolated. The higher current results in higher voltages applied to the MTJ element 28.

BRIEF SUMMARY OF THE INVENTION

The present invention seeks to reduce the amount of current required for a write operation by using a process for forming the read conductor within a recessed write conductor, the write conductor itself formed within a trench of an insulating layer. The present invention protects the MTJ from the voltages created by the write conductor by isolating the write conductor and enabling the reduction of current necessary to write a bit of information.

BRIEF DESCRIPTION OF THE DRAWINGS

The above-described features and advantages of the invention win be more clearly understood from the following detailed description, which is provided with reference to the accompanying drawings in which.

DETAILED DESCRIPTION OF THE INVENTION

In the following detailed description, reference is made to specific exemplary embodiments of the invention. It is to be understood that other embodiments may be employed, and that structural and electrical changes may be made without departing from the spirit or scope of the present invention.

The term "semiconductor substrate" is to be understood to include any semiconductor-based structure that has an exposed semiconductor surface. The semiconductor structure should be understood to include silicon, silicon-on-insulator (SOI), silicon-on-sapphire (SOS), doped and undoped semiconductors, epitaxial layers of silicon supported by a base semiconductor foundation, and other semiconductor structures. The semiconductor substrate need not be silicon-based. The semiconductor could be silicon-germanium, germanium, or gallium arsenide. When reference is made to a semiconductor substrate in the following description, previous process steps may have been utilized to form regions or junctions in or over the base semiconductor or foundation. Also, the invention may be formed over non-semiconductor substrates.

The steps below are discussed as being performed in an exemplary order, however this order may be altered and still maintain the spirit and scope of the invention.

Figure 1:
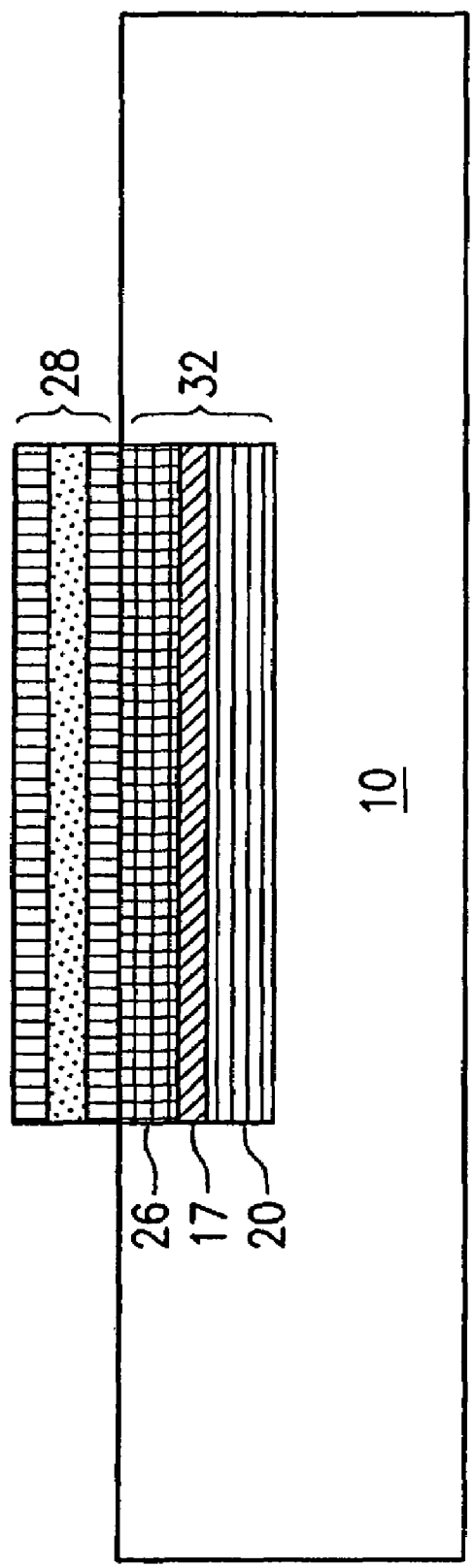
FIG. 1 depicts a conventional MRAM cell structure.
Figure 2:
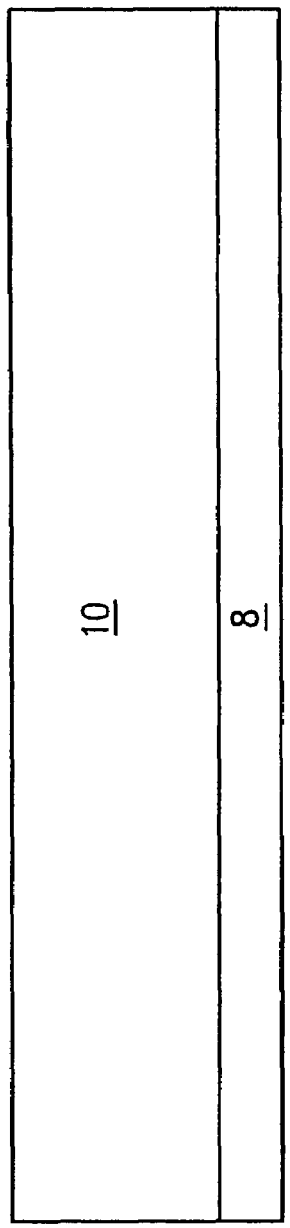
FIG. 2 depicts a stage of processing of an MRAM device, in accordance with an exemplary embodiment of the invention.

Referring now to the drawings, where like elements are designated by like reference numerals, FIG. 2 depicts a cross-section of an MRAM memory cell during an intermediate stage of processing, wherein a first insulating layer (preferably an oxide layer) 10 is formed over a substrate 8, for example, a semiconductor substrate. The oxide layer 10 is preferably comprised of silicon oxide, but could be comprised of other well known oxide materials such as silicon dioxide, aluminum oxide, or tetraethylorthosilicate (TEOS). For simplicity of description, the substrate 8 is omitted in FIGS. 3-17.

Figure 3:
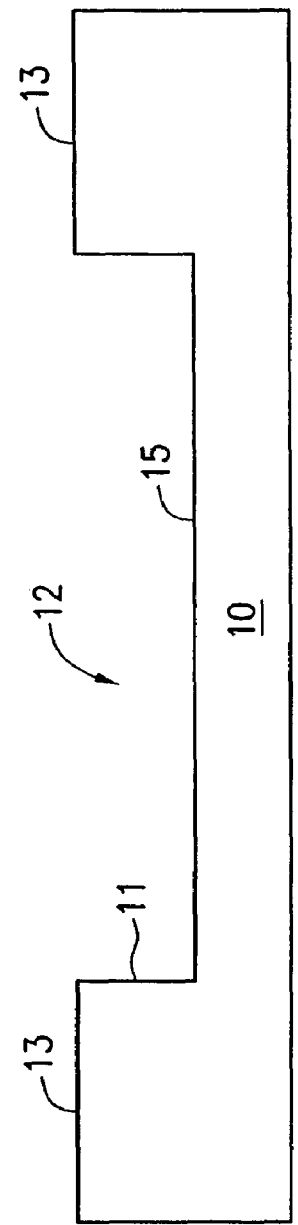
FIG. 3 depicts a further stage of processing of the FIG. 2 MRAM device.

With reference to FIG. 3, a trench 12 is etched into the oxide layer 10 by chemical etching, reactive ion etching (RIE), or other means of creating a trench in the oxide layer 10. The trench 12 creates an oxide layer 10 having a first upper level 13 and second lower level 15, both first and second levels connected by a sidewall region 11.

Figure 4:
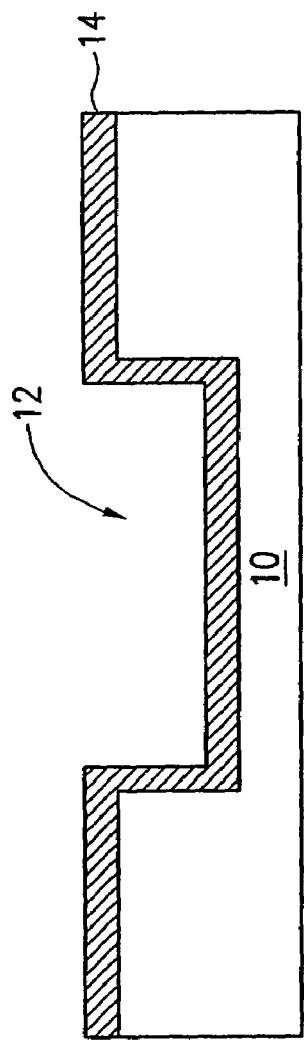
FIG. 4 depicts a further stage of processing of the FIG. 3 MRAM device.

In FIG. 4, a liner 14 is deposited on the silicon oxide layer 10. The liner 14 can be formed of a material selected from the group including, but not limited to, tantalum (Ta), titanium (Ti), titanium-tungsten (TiW), titanium-nitride (TiN), tungsten-silicide ($WSi_2$), tungsten-nitride (WN), or chromium (Cr). The liner 14 is optional, but preferred because it serves as an adhesion layer for a later formed ferromagnetic cladding layer 16 (FIG. 5).

It should be noted that trench 12 may optionally be filled with material used to form the liner 14, or any other subsequent layer, and then, through etching or abrasion of the structure, the trench 12 could be redefined. This ensures that each subsequent layer is formed within the trench 12.

Figure 5:
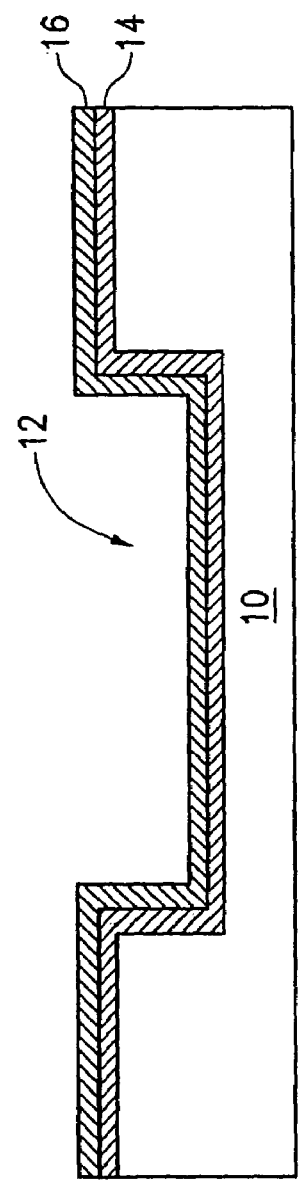
FIG. 5 depicts a further stage of processing of the FIG. 4 MRAM device.
Figure 7:
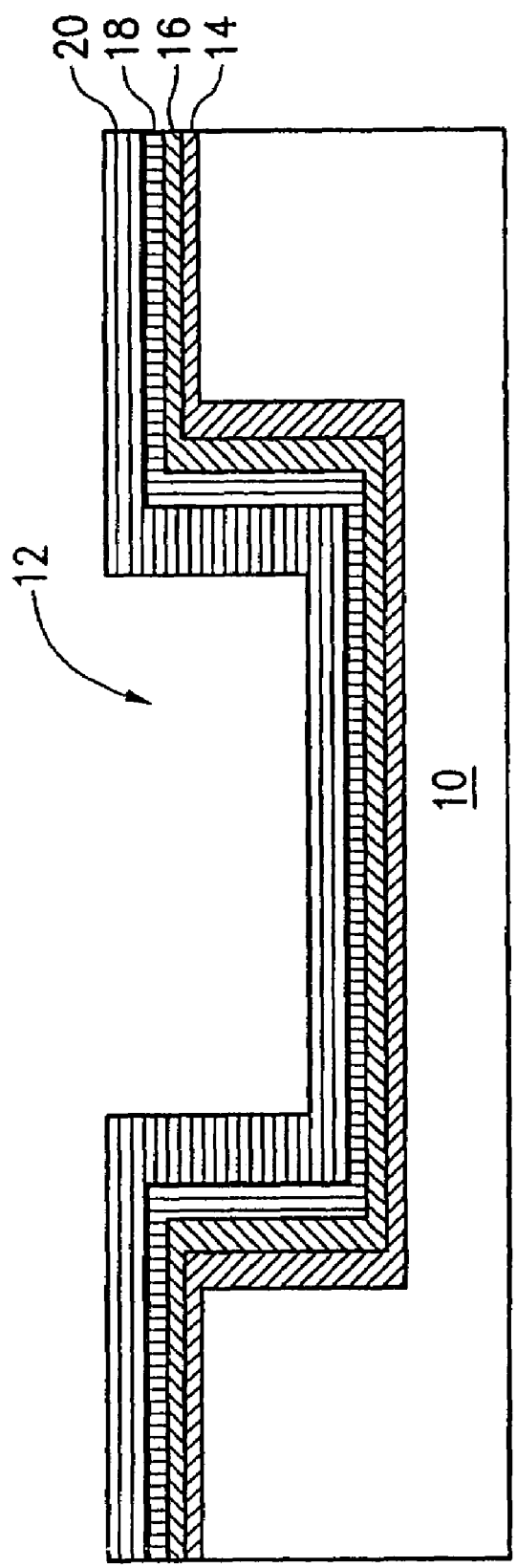
FIG. 7 depicts a further stage of processing of the FIG. 6 MRAM device.

As depicted in FIG. 5, a ferromagnetic cladding layer 16 is deposited over the liner 14. The ferromagnetic cladding layer 16 can be formed from a variety of materials, including, but not limited to, nickel-iron (Ni—Fe), cobalt-iron (Co—Fe), cobalt-nickel-iron (Co—Ni—Fe), iron (Fe), nickel (Ni), cobalt (Co), or other highly permeable materials. The ferromagnetic cladding layer 16 provides a closed magnetic path (flux closure) around a subsequently formed write conductor 20 (FIG. 7). The ferromagnetic cladding layer 16 also substantially attenuates fringe magnetic fields that can interfere or corrupt bit information stored in the MTJ elements of neighboring memory cells.

Figure 6:
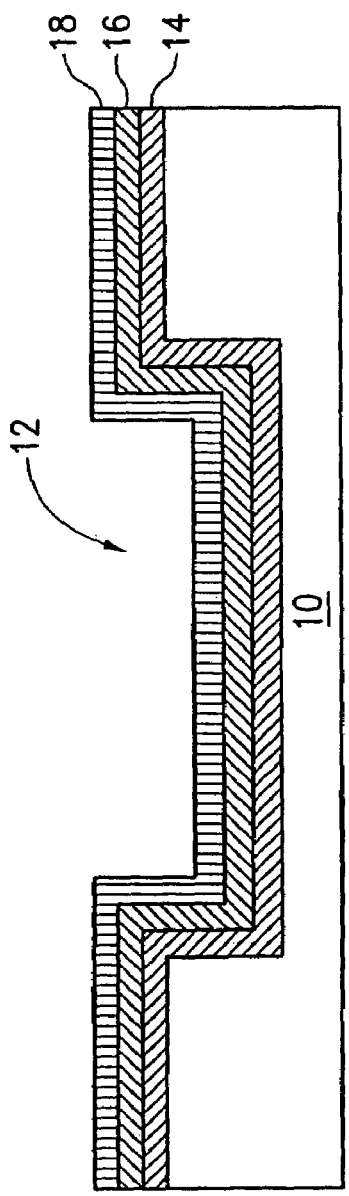
FIG. 6 depicts a further stage of processing of the FIG. 5 MRAM device.

Referring to FIG. 6, a barrier layer 18 is provided over the ferromagnetic cladding layer 16. The barrier layer 18 may be formed of a conventional insulator, for example, a low pressure chemical vapor deposition (CVD) oxide, a nitride, such as $Si_3N_4$, low pressure or high pressure TEOS, or boro-phospho-silicate glass (BPSG). The barrier layer 18 is an optional layer, and is preferable if the resistance of the cladding material used to form the ferromagnetic cladding layer 16 is greater than $1/10$ the resistance of the conductor material used to form the write conductor 20 (FIG. 7). The barrier layer 18 is also preferable if the cladding material used to form the ferromagnetic cladding layer 16 is not fully removed from the regions between the write conductor 20 (FIG. 7) and the read conductor 26 (FIG. 11) during further processing. The barrier layer 18 serves as an adhesion layer, and prevents the migration of the conductive material used to form the write conductor 20 (FIG. 7) into the lower layers.

Figure 6A:
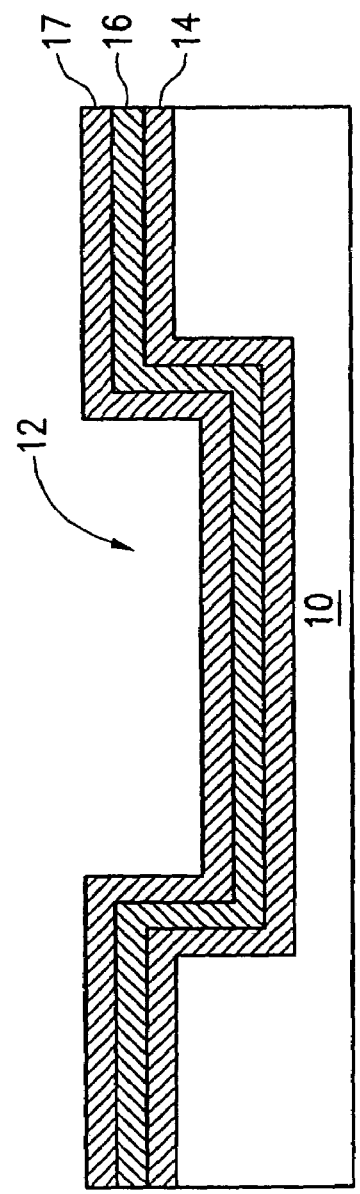

It should be noted that if the barrier layer 18 is not formed, a liner 17 (FIG. 6A) could be formed over the ferromagnetic cladding layer 16. The liner 17 can be formed of a material selected from the group including, but not limited to, tantalum (Ta), titanium (Ti), titanium-tungsten (TiW), titanium-nitride (TiN), tungsten-silicide ($WSi_2$), tungsten-nitride (WN), or chromium (Cr). The liner is optional, but preferred in the absence of the barrier layer 18 because it serves as an adhesion layer for the write conductor 20 (FIG. 7).

In FIG. 7, a write conductor 20 is formed over the barrier layer 18. The write conductor 20 is preferably made of copper. It should be noted that the write conductor 20 could be made of other conductive materials, including, but not limited to, tungsten, platinum, gold, silver, or aluminum.

Figure 8:
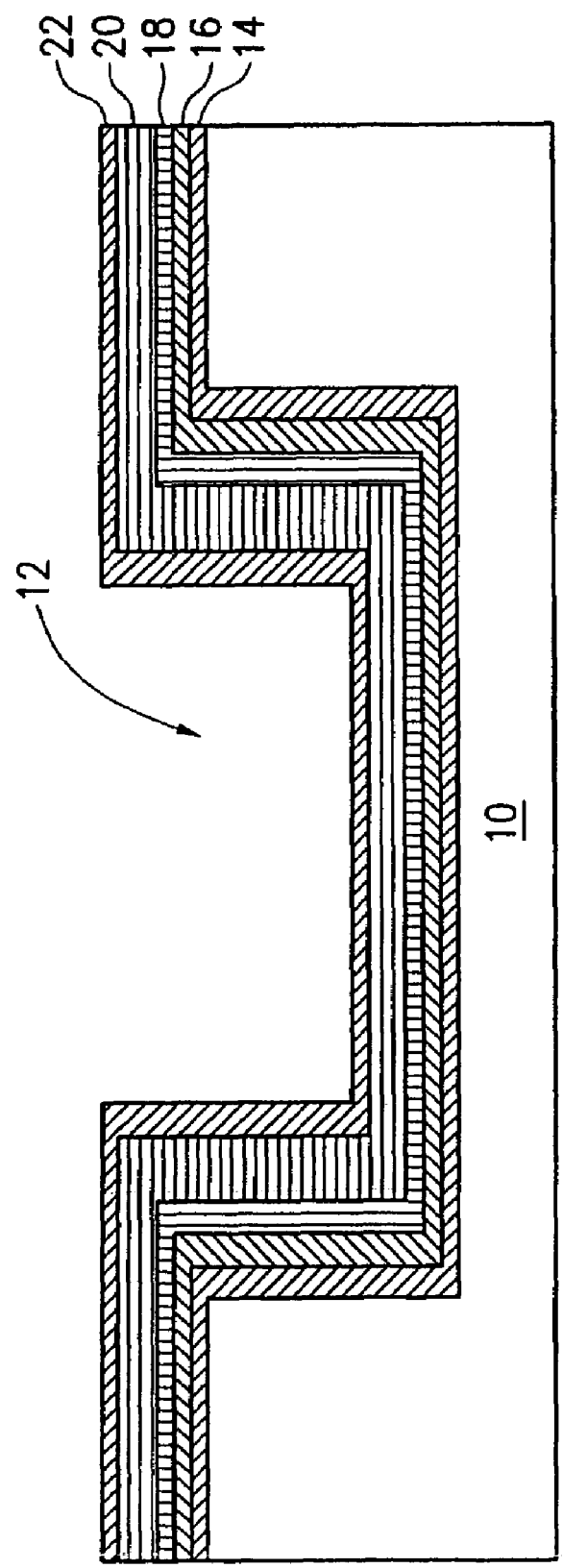
FIG. 8 depicts a further stage of processing of the FIG. 7 MRAM device.

In FIG. 8, a second insulating layer 22 is deposited (the oxide layer 10 being the first insulating layer). The second insulating layer 22 can be formed of a variety of materials, including, but not limited to, silicon nitrides, alumina oxides, oxides, high temperature polymers, or a dielectric material.

Figure 9:
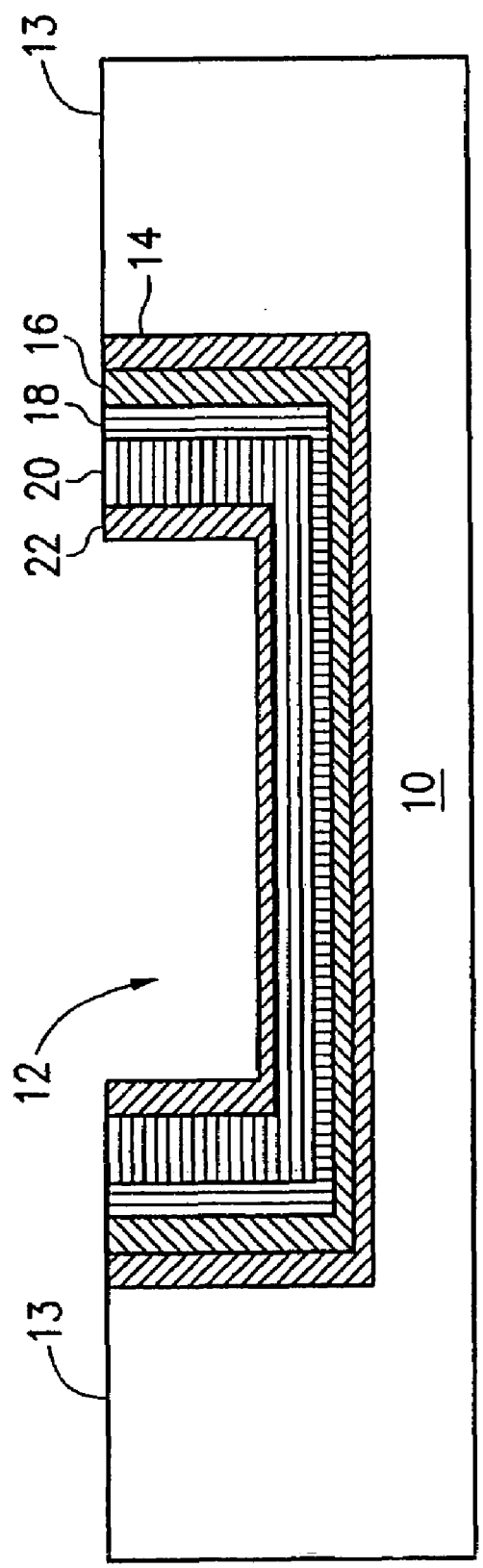
FIG. 9 depicts a further stage of processing of the FIG. 8 MRAM device.

In FIG. 9, the layers that have been formed on the first level 13 of the oxide layer 10 are removed, for example, by chemical-mechanical polishing (CMP) or RIE dry etching, creating an oxide layer 10 with a trench 12 that has a liner 14, a ferromagnetic cladding layer 16, a barrier layer 18, a write conductor 20, and a second insulating layer 22.

Figure 10:
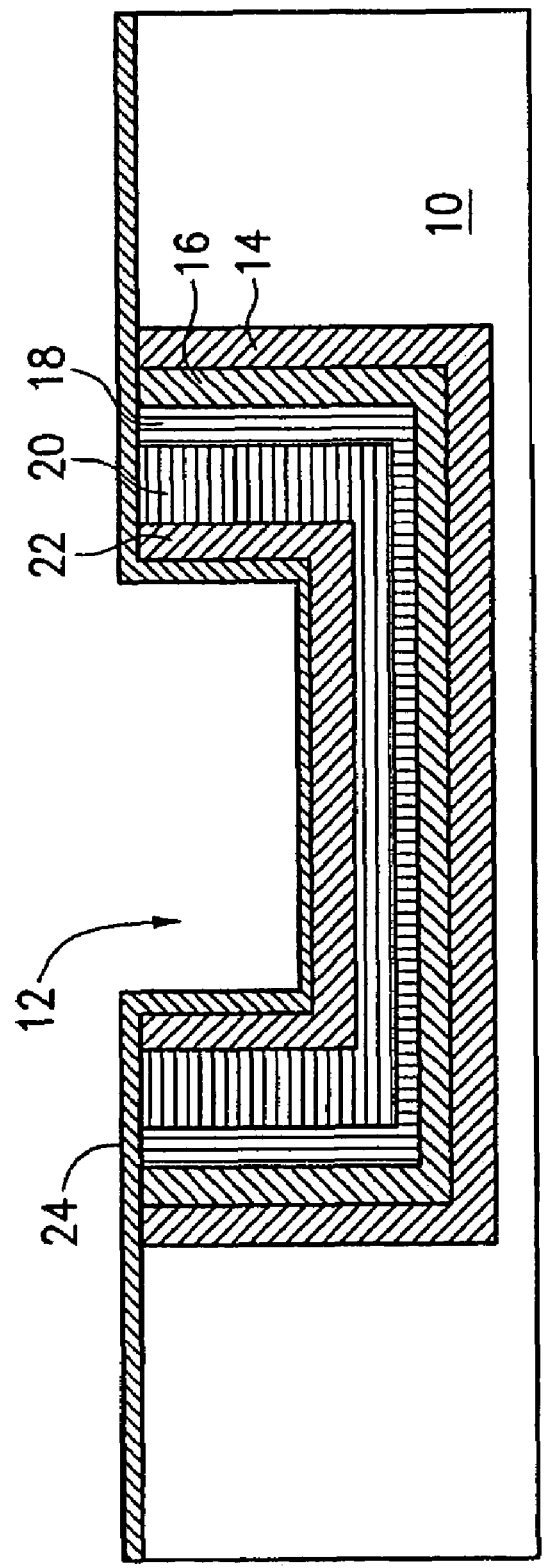
FIG. 10 depicts a further stage of processing of the FIG. 9 MRAM device.
Figure 11:
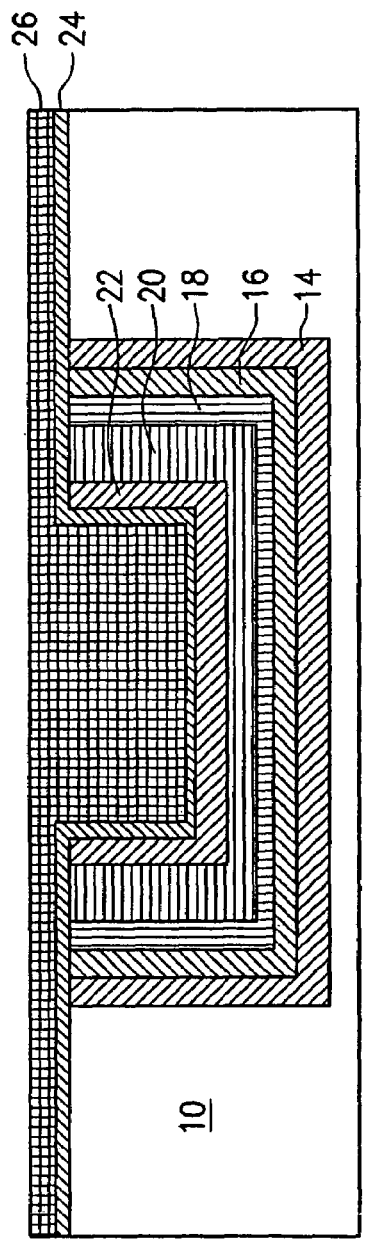
FIG. 11 depicts a further stage of processing of the FIG. 10 MRAM device.
Figure 11A:
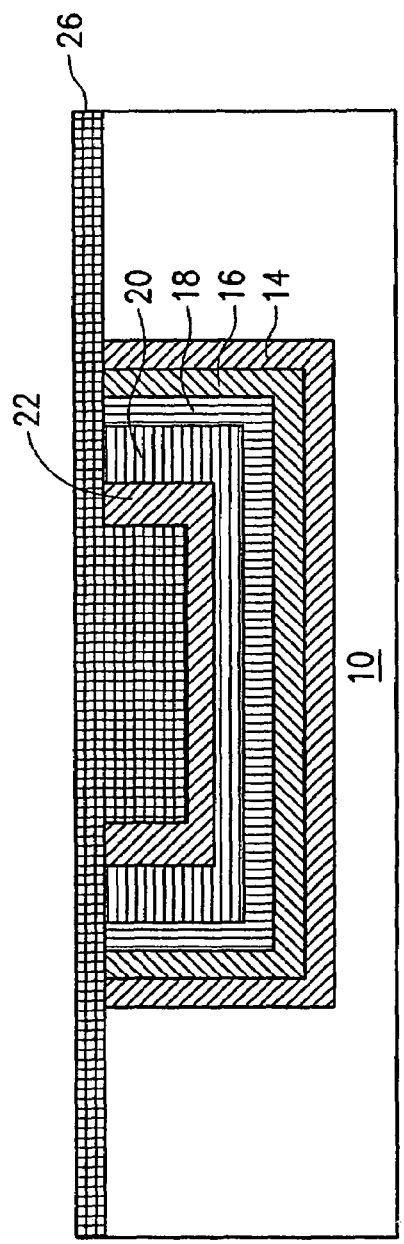

Referring to FIG. 10, a third insulating layer 24 is formed over the entire FIG. 9 structure. The third insulating layer 24 is optional. Preferably, a read conductor 26 is formed over the third insulating layer 24 and within the trench, as shown in FIG. 11. However, it should be noted that the read conductor 24 could be formed directly over the second insulating layer 22 as shown in FIG. 11A. The read conductor 26 is preferably formed of copper (Cu), but could be made of any other conductive material, including, but not limited to, tungsten, platinum, gold, silver, tantalum, or aluminum.

Figure 12:
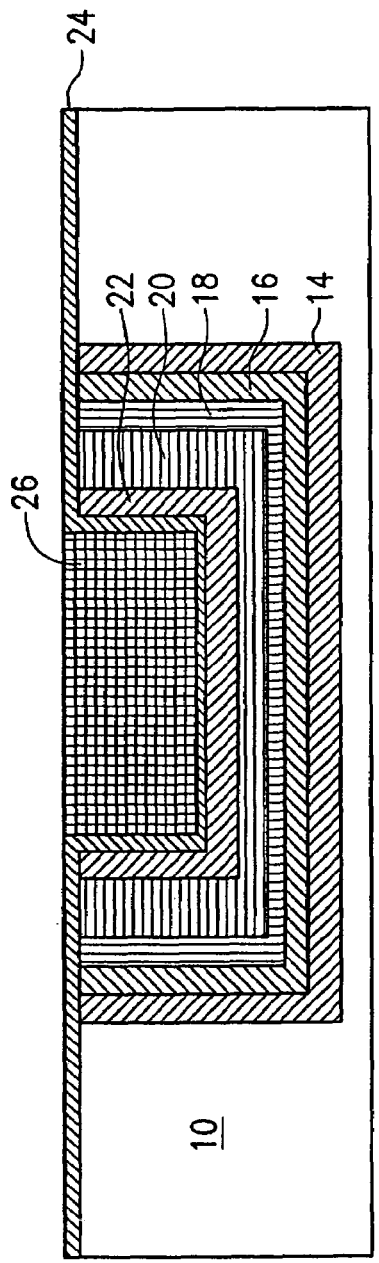
FIG. 12 depicts a further stage of processing of the FIG. 11 MRAM device.
Figure 12A:
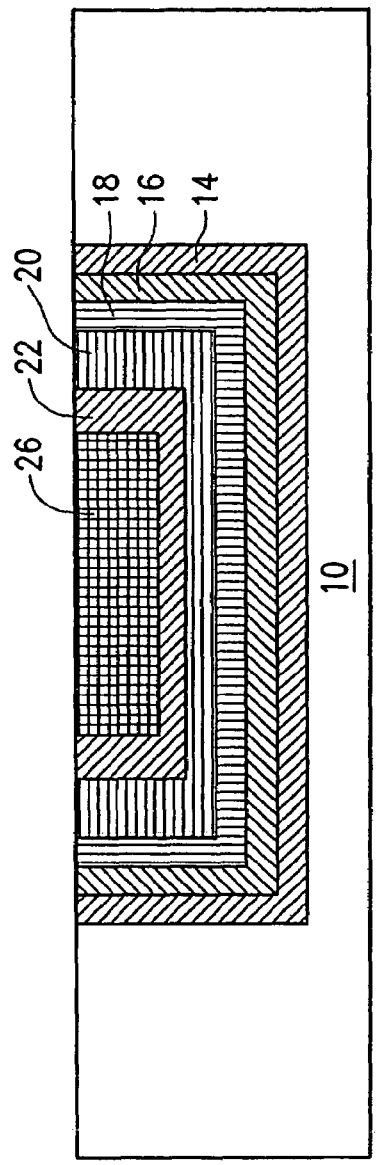

The excess material used to form the read conductor 26 is then removed through mechanical abrasion, for example, conventional CMP methods, creating a planarized surface in which the topmost surface of the read conductor 26 is planar to the topmost surface of the third insulating layer 24 (FIG. 12). Planarizing the structure of FIG. 11A would result in the structure depicted in FIG. 12A, specifically, a topmost surface of the read conductor 26 is planar to a topmost surface of the second insulating layer 22.

Figure 13:
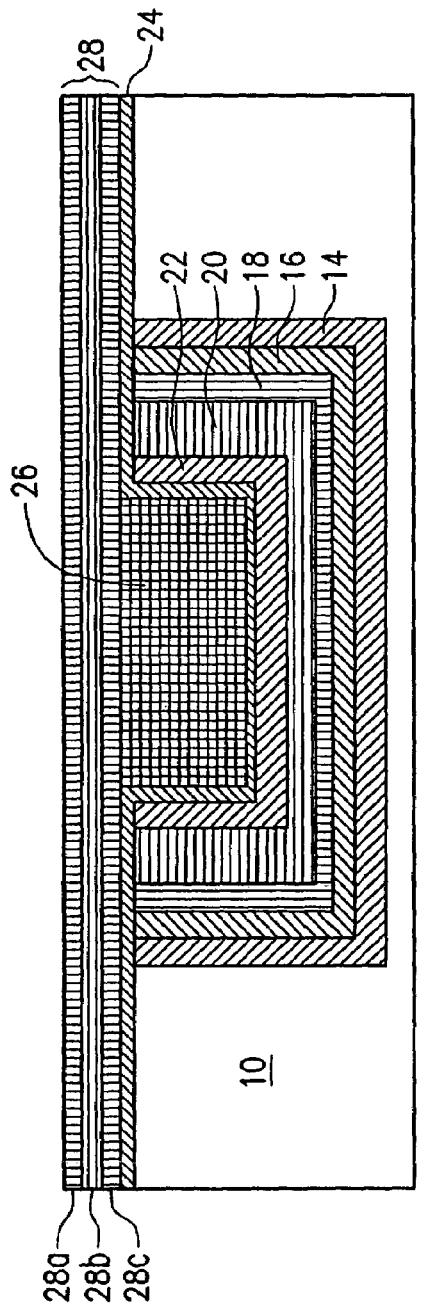
FIG. 13 depicts a further stage of processing of the FIG. 12 MRAM device.
Figure 13A:
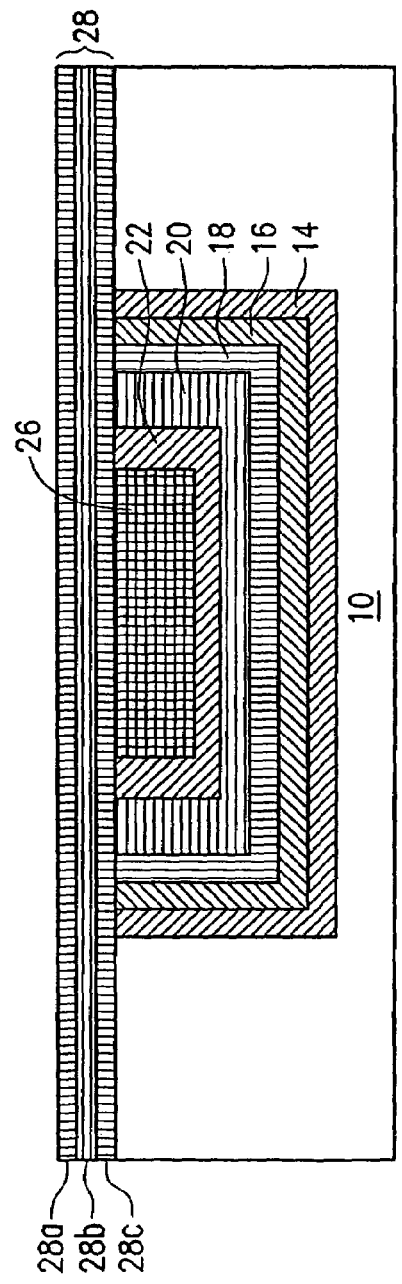

Referring to FIGS. 13 and 13A, layers that will form an MTJ element 28 are next formed. The MTJ element 28 is formed by three layers, a pinned magnetic layer 28a, a tunnel barrier layer 28b, and a free magnetic layer 28c. It should be noted that a variety of other layers could be included, but are omitted for purposes of clarity. It should also be noted that the three functional layers could be formed in reverse order.

Figure 14:
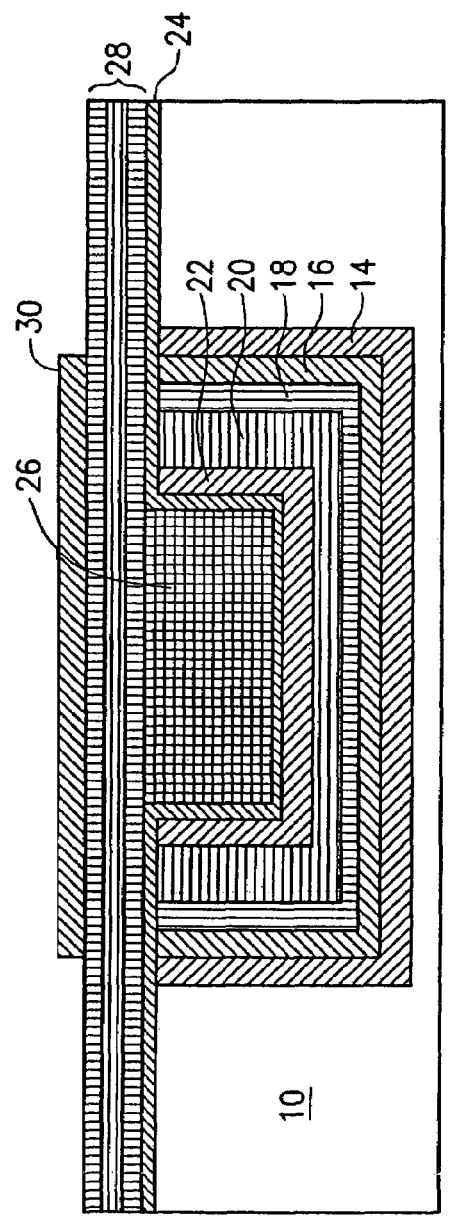
FIG. 14 depicts a further stage of processing of the FIG. 13 MRAM device.
Figure 14A:
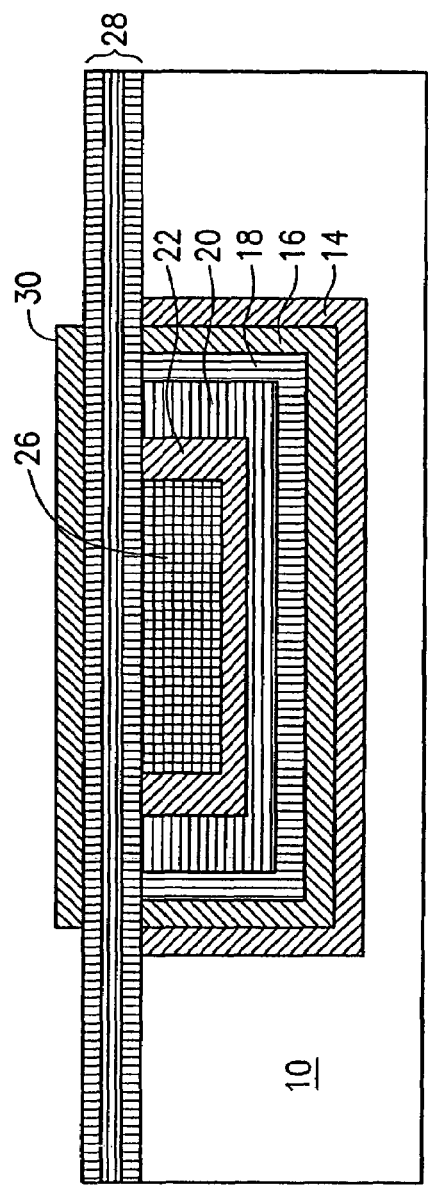
Figure 15:
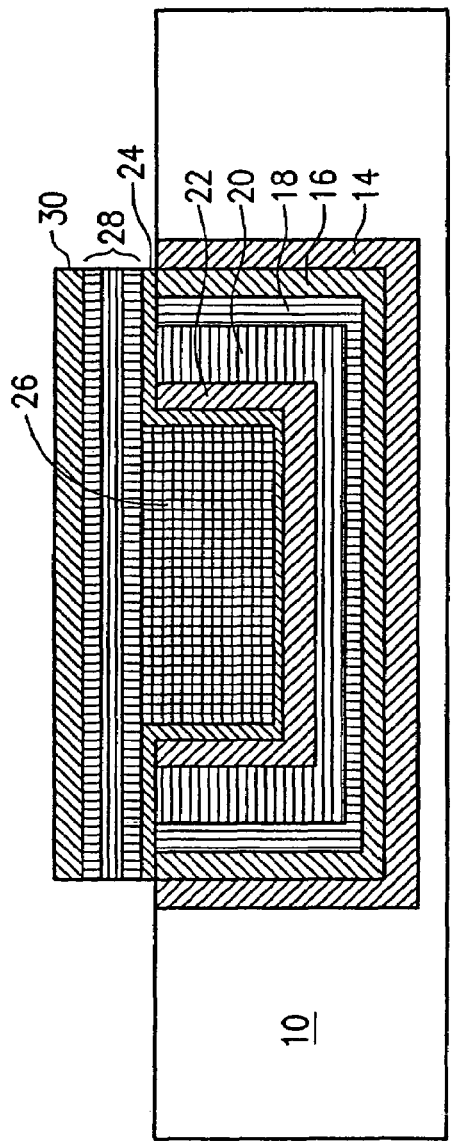
FIG. 15 depicts a further stage of processing of the FIG. 14 MRAM device.
Figure 15A:
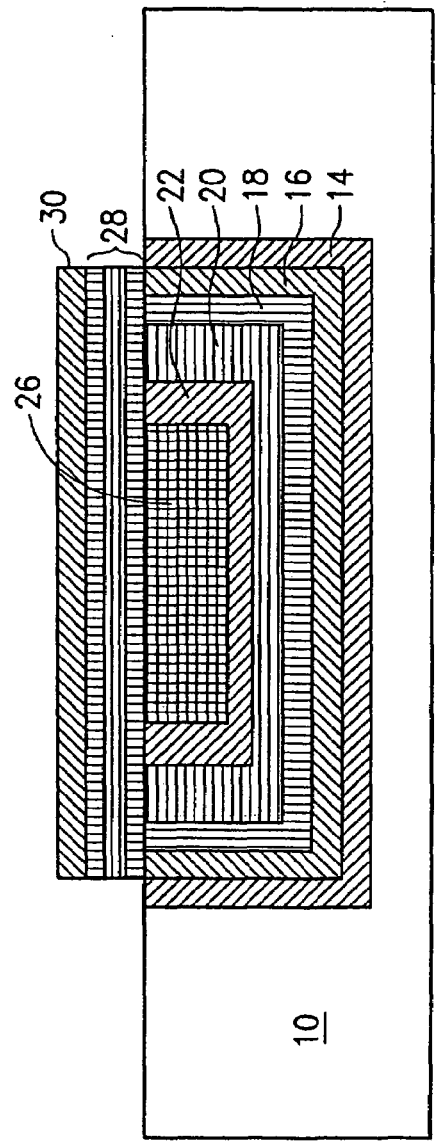
Figure 16:
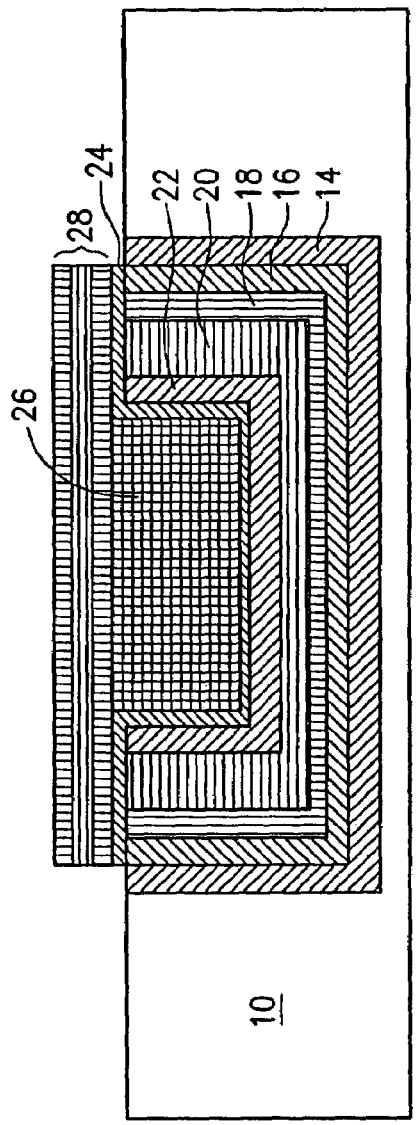
FIG. 16 depicts a further stage of processing of the FIG. 15 MRAM device.
Figure 16A:
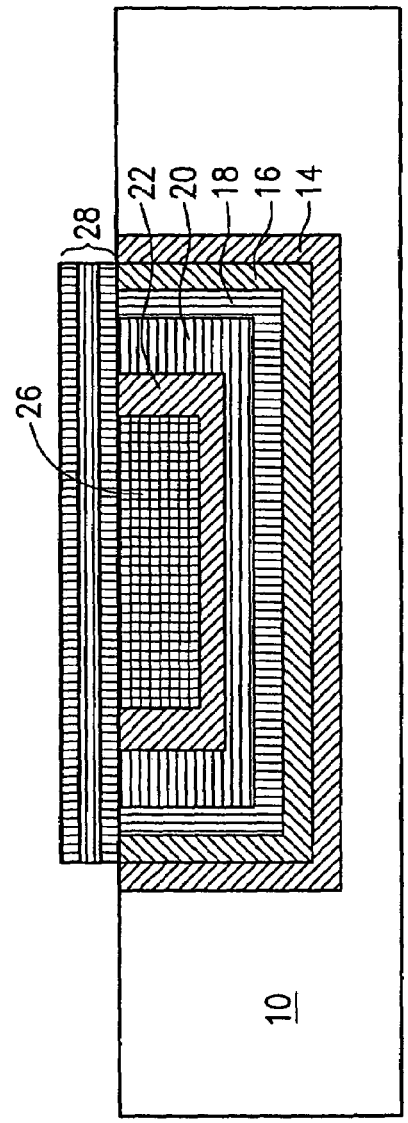

FIG. 14 depicts the deposition of a hard mask 30. The hard mask 30 serves as an etch barrier and protects the underlying MTJ element 28 during any further processing. The MTJ element 28 is patterned, or etched, as shown in FIGS. 15 and 15A. In FIGS. 16 and 16A, the hard mask 30 is removed, and the resulting structure is an MRAM structure wherein the read conductor 26 is formed within a recess of the write conductor 20. The preceding processes result in a self-aligned, low-resistant, and efficient formation of read and write conductors.

Figure 17:
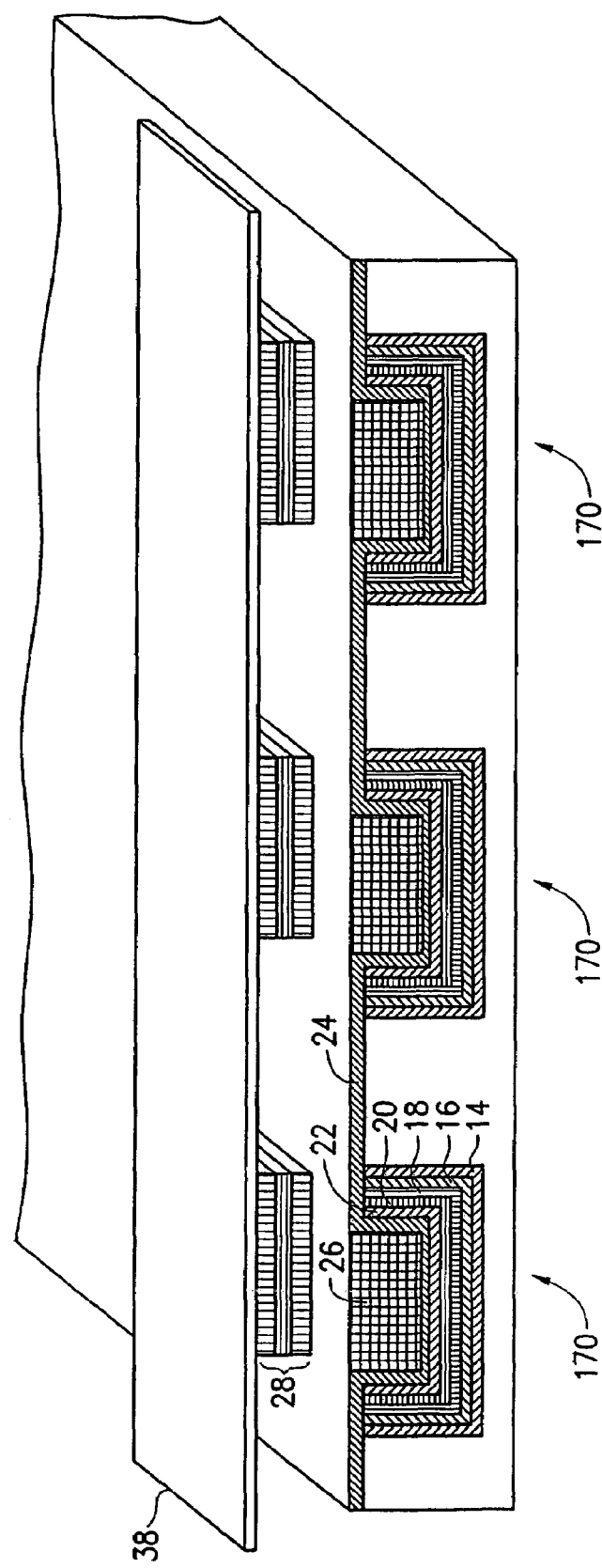
FIG. 17 is a cutaway perspective view of a semiconductor chip containing a plurality of MRAM devices according to an exemplary embodiment of the invention.

FIG. 17 is a cutaway perspective view of a semiconductor chip 100 containing a plurality of MRAM devices 170 manufactured in accordance with FIGS. 2-16. In accordance with an exemplary embodiment of the invention, each of a plurality of MRAM devices 170 has a read conductor 26 formed in a trench of a write conductor 20. The etching to form the MTJ elements 28 assures discrete MTJ element islands formed over the read conductor 26. A sense line 38 is positioned orthogonally above the MTJ elements 28. The sense line 38 is preferably formed of copper (Cu). It should be noted that the sense line 38 could be made of other conductive materials, including, but not limited to, tungsten-nitride, tungsten, platinum, gold, silver, or aluminum. The sense line 38 is activated during a read or write operation. The sense line 38, in conjunction with the read conductor 26 or write conductor 20, selects the MTJ element 28 in the array that will either be written to or read from.

Figure 18:
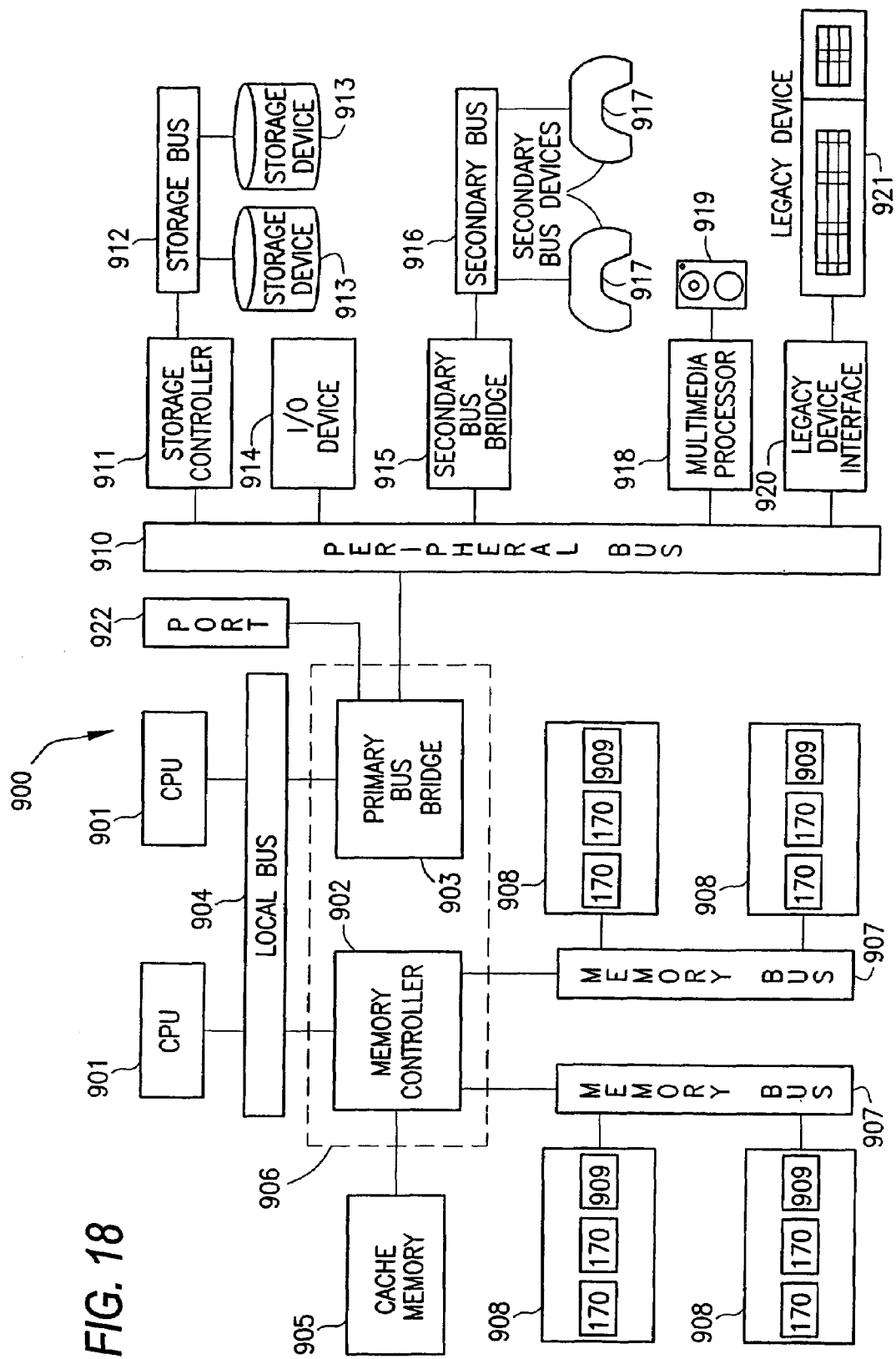
FIG. 18 is a schematic diagram of a processor system incorporating an MRAM device in accordance with an exemplary embodiment of the invention.

FIG. 18 illustrates an exemplary processing system 900 utilizing the MRAM memory device as described in connection with FIGS. 2-17. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one MRAM memory device 170 contains a plurality of MTJ memory elements formed in accordance with the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be a universal serial port (USB) controller used to couple USB devices 917 via to the processing system 900. The multimedia processor 918 may be a sound card, a video capture card, or any other type of media interface, which may also be coupled to one additional device such as speakers 919. The legacy device interface 920 is used to couple legacy devices, for example, older styled keyboards and mice, to the processing system 900.

The processing system 900 illustrated in FIG. 18 is only an exemplary processing system with which the invention may be used. While FIG. 18 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 170. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. Accordingly, the invention is not limited by the foregoing description, but rather is limited only by the scope of the appended claims.

What is claimed as new and desired to be protected by Letters Patent of the United States is:

1. A memory array structure, comprising:
   a plurality of memory cell structures, each of said memory cell structures comprising:
   a trench in a first insulating layer defining first and second levels, said and second levels being connected by at least a sidewall region;
   a ferromagnetic cladding layer formed within said trench and over said second level and said sidewall region of said first insulating layer;
   a first conductive layer formed within said trench and over a second level and a sidewall region of said ferromagnetic cladding layer;
   a second insulating layer formed within said trench and over a second level and a sidewall region of said first conductive layer;
   a second conductive layer formed within said trench; and
   a magnetic tunnel junction element formed over said second conductive layer.

2. The memory array structure of claim 1, further comprising said first insulating layer formed over a semiconductor substrate.

3. The memory array structure of claim 1, wherein said first conductive layer is a write conductor, and said second conductive layer is a read conductor.

4. The memory array structure of claim 1, wherein said first and second conductive layers are formed of a material selected from the group consisting of tungsten-nitride, tungsten, platinum, gold, silver, aluminum, and copper.

5. The memory array structure of claim 1, wherein a topmost surface of said second conductive layer is planar to a topmost surface of said first conductive layer.

6. The memory array structure of claim 1, wherein said topmost surface of said second conductive layer, and said topmost surface of said first conductive layer are planar to a topmost surface of said first insulating layer.

7. The memory array structure of claim 1, further comprising a liner formed between said first insulating layer and said ferromagnetic cladding layer.

8. The memory array structure of claim 1, further comprising a barrier layer formed between said ferromagnetic cladding layer and said first conductive layer.

9. The memory array structure of claim 1, further comprising a liner formed between said ferromagnetic cladding layer and said first conductive layer.

10. The memory array structure of claim 1, wherein said magnetic tunnel junction element comprises:
    a pinned magnetic layer;
    a tunnel barrier layer; and
    a free magnetic layer.

11. A memory device comprising a plurality of magnetoresistive random access memory cell structures arranged in an array, each of said magnetoresistive random access memory cell structures comprising:
    a trench in a first insulating layer defining first and second levels, said and second levels being connected by at least a sidewall region;
    a ferromagnetic cladding layer formed within said trench and over said second level and said sidewall region of said first insulating layer;
    a first conductive layer formed within said trench and over a second level and a sidewall region of said ferromagnetic cladding layer;
    a second insulating layer formed within said trench and over a second level and a sidewall region of said first conductive layer;
    a second conductive layer formed within said trench; and
    a magnetic tunnel junction element formed over said second conductive layer.

12. A memory cell array comprising:
    a plurality of magnetoresistive random access memory cell structures, each of said magnetoresistive random access memory cell structures comprising:
    a trench in a first insulating layer defining first and second levels, said and second levels being connected by at least a sidewall region;
    a ferromagnetic cladding layer formed within said trench and over said second level and said sidewall region of said first insulating layer;
    a first conductive layer formed within said trench and over a second level and a sidewall region of said ferromagnetic cladding layer;
    a second insulating layer formed within said trench and over a second level and a sidewall region of said first conductive layer;
    a second conductive layer formed within said trench; and
    a magnetic tunnel junction element formed over said second conductive layer.

* * * * *